United States Patent
Carruthers et al.

(10) Patent No.: US 6,917,174 B2
(45) Date of Patent: Jul. 12, 2005

(54) COST-EFFECTIVE MEASUREMENT OF LARGE MACHINE CURRENTS

(75) Inventors: Peter A. Carruthers, Ithaca, NY (US); Garey G. Roden, Apalachin, NY (US)

(73) Assignee: BAE Systems Controls, Inc., Johnson City, NY (US)

( * ) Notice: Subject to any disclaimer, the term of this patent is extended or adjusted under 35 U.S.C. 154(b) by 0 days.

(21) Appl. No.: 10/730,541

(22) Filed: Dec. 8, 2003

(65) Prior Publication Data

US 2005/0122077 A1 Jun. 9, 2005

(51) Int. Cl.$^7$ ............................................. G01R 19/00
(52) U.S. Cl. ...................................... 318/450; 318/474
(58) Field of Search .............................. 318/450, 474, 318/490, 491

(56) References Cited

U.S. PATENT DOCUMENTS 4,841,213 A * 6/1989 Tomasek ..................... 318/661
4,952,853 A * 8/1990 Archer ........................ 318/284
5,530,303 A * 6/1996 Takei .......................... 310/12
6,528,960 B1 * 3/2003 Roden et al. ................ 318/254

* cited by examiner

Primary Examiner—Bentsu Ro
(74) Attorney, Agent, or Firm—William H. Meise; Geoffrey H. Krauss

(57) ABSTRACT

The increasing use of electrically powered vehicles has created a need for inexpensively and effectively measuring high currents for motor control, as for example digital motor control. Because the high operating voltages of traction motors, the motor current sensors should be non-contacting. A non-contacting current sensor having a rated capacity significantly less than the motor winding current is coupled to one or more of the conductors of a paralleled multiconductor motor winding for sensing the current in that conductor. The paralleled electrical motor conductors are paralleled by additional similar conductors, so that only a fraction of the current to be measured flows through the conductor(s) associated with the sensor. The current sensor elements may be mounted on a pc board, which supports the elements, and also has one or more printed patterns which define conductors associated with the sensor.

10 Claims, 8 Drawing Sheets

COST-EFFECTIVE MEASUREMENT OF LARGE MACHINE CURRENTS

FIELD OF THE INVENTION

This invention relates to the measurement of relatively large currents, namely those in the range of a hundred or so amperes to at least several thousands of amperes, especially in the context of motor control in vehicles powered at least in part by electricity.

BACKGROUND OF THE INVENTION

Electrically powered vehicles have recently become more important as environmental concerns grow. A problem with electrically powered vehicles is that with current technology, vehicle range is limited to an extent that many users find inconvenient. The use of hybrid internal-combustion/electric vehicles has been proposed in order to address the problem of limited range, and such vehicles are beginning to find use.

Many electrical power and drive schemes have been proposed and tried. Many of these techniques rely on microprocessor- or digital-signal-processor-controlled controllers, which perform sophisticated analyses for generating the desired control signals which, in turn, control the application of relatively large traction currents to the vehicle traction motor. Among these sophisticated control schemes is the field-oriented-control (FOC) of induction traction motors. Sophisticated controllers generally require substantial information about the vehicle operator commands, the state of the battery charge, the vehicle speed, and the motor current or currents, in the context of multiphase or polyphase motors. Such controllers may also provide for dynamic braking, in which vehicle kinetic energy is returned to the traction battery concurrently with braking. The controllers may also control the operation of an internal combustion engine in the case of hybrid electric vehicles. The required information often involves the measurement of motor and or battery currents and phases.

FIG. 1 illustrates a vehicle designated generally as 10 includes a rotational vehicle drive device illustrated as a wheel 12, as described in U.S. Pat. No. 6,528,960 issued Mar. 4, 2003 in the name of Roden et al. In FIG. 1, wheel 12 is mechanically coupled by way of a mechanical coupling 14 to a motor 16. Vehicle 10 also includes a source 18 of electrical energy or power, which may be, for example, an electrochemical battery or a generator driven by a prime mover, or may possibly be an ultra-high-capacity capacitor. Energy source 18 is coupled to motor 16 by means of a power-controlling device illustrated as a switcher block 20. Switcher block 20 controls the application of electrical energy or power to motor 16 under the control of a controller, processor or digital signal processor (DSP) 22. Controller 22 responds to user command signals such as braking signals and "accelerator" or "throttle" signals from the user. The origin of such user signals is illustrated as a block 24.

Vehicle 10 of FIG. 1 is generic, in that the description is generally applicable to all "series" vehicles which are at least partially powered by electricity. One sophisticated type of induction motor control is field-oriented control (FOC). Field-oriented controllers make use of a great deal of information relating to the vehicle operation, including operator control input signals, signals representing the motor current, D.C. bus, motor drive voltage, and, if battery condition is to be monitored and maintained, battery current, temperature and the like. In FIG. 1, a resolver (R) is illustrated as being coupled to mechanical drive coupling 14, for generating a motor or wheel position signal for application to the controller 22. In actual practice the motor rotor position is derived from the resolver. The motor velocity and acceleration may then be calculated from the change in position as a function of time. In addition to the resolver input signals, controller 22 of FIG. 1 receives at least one signal from a current sensor C coupled to measure the electrical current in a motor power conductor $16i_1$. In the case of a polyphase motor, a motor current signal may be received by controller 22 for all but one of the motor power conductors, and the current in the last, unmeasured power conductor can be calculated from the remaining currents. The measurements of motor current and bus voltage allow control of the motor phase currents, so that the motor torque can be most efficiently controlled over a wide speed range.

Since the motor performance and control is determined, at least in part, from measurements of current, it is important that the currents so measured be accurate. This is particularly so in the case in which a polyphase motor is used, because the calculations may include taking the differences between or among the various currents. If the sensors are not very accurate, the calculated differences may be very inaccurate.

As mentioned, the currents drawn by the traction motor in a vehicle context may be hundreds or even thousands of amperes in magnitude. Resistive current sensors such as a series resistor and associated voltammeter are not practical, because of the effect on the fuel economy or range of the vehicle of the heating losses caused by the flow of the motor current through the resistance, and also because the varying current in the resistor results in a change in its resistance, requiring some sort of calibration to maintain accuracy. An additional disadvantage of simple resistive current sensors is that they are not electrically isolated, so the bus voltage source is coupled to the system controller, which can undesirably couple dangerous or damaging voltages to the controller under certain circumstances. Commercial current measuring devices capable of accurately measuring currents in the range of hundreds and thousands of amperes are available, but are expensive. Among such sensors are "closed loop" current transducers such as type LT 505-S/ SP8, manufactured by LEM Business Area Components, 8, Chemin des Aulx, CH-1228 Plan-les-Ouates, Switzerland, which also has offices in the U.S. at 27 RT 191A, PO Box 1207, Amherst, N.H. 03031. Other versions of this type of transducer which are available at relatively small cost are the type LTS 25, which have a nominal current capacity of 25 amperes. In addition, other inexpensive current transducers of the "open-loop" type are available. These tend to be less accurate than the "closed-loop" type, and are subject to unwanted noise pickup, and gain and offset drift with temperature. Plot 510 of FIG. 5 illustrates the characteristic of the nominal 25-amp rated LTS 25. In FIG. 5, the sensed signal at zero transducer current is at a finite value V, which corresponds to about 2 ½ volts, which is half of the energizing voltage of 5 volts. Signal output greater than 2½ volts represents "positive" current directions, and signal outputs less than 2½ volts represent "negative" currents. As illustrated, the nominal (NOM) transducer current is not the value at which the sensed current is limited, but rather lies near the center of each side of the plot; the NOM value for the LTS 25 is 25 amperes. The sensor output signal limits in both the positive and negative directions at a value of current which is designated "max." In the case of the LTS 25, these correspond to about 80 amperes.

As described in the abovementioned Roden et al. patent, the sensing of the motor current in an electrically powered vehicle is performed by a current sensing arrangement including a commercial current sensor capable of measuring a maximum current much smaller than the peak motor current, together with a current dividing scheme which allows most of the motor current in any particular phase to flow to the motor without measurement, and which passes only a fraction of the motor current of that phase through the current sensor.

FIG. 2a illustrates one embodiment of a current sensor arrangement 210 suitable for use for measuring motor current in one form of electrically powered vehicle, as described in the Roden et al. patent. In FIG. 2a, arrangement 210 includes a first lug, terminal or electrode 212 which is made from a conductive material such as plated copper. Lug 212 includes a flat portion 212f defining an aperture 212a dimensioned to clear a screw or bolt for fastening the lug to a further electrical conductor. In addition to flat portion 212a, lug 212 includes an offset conductor-clamping portion 212occ. Conductor-clamping portion 212occ defines a receptacle (not visible in FIG. 2a) into which the ends of electrical conductors or wires 216, 218, 220, and 222 are placed. The ends of electrical conductors 216, 218, 220, and 222 are crimped in place and forced into intimate electrical contact with the conductor-clamping portion 220occ by a pair of crimps or indentations 212c1 and 212c2. As illustrated, each electrical conductor 216, 218, 220 and 222 is insulated by an insulating layer 216i, 218i, 220i, and 222i. As also illustrated in FIG. 2a, the remote ends of wires 216, 218, 220, and 222 are inserted into a receptacle 214R in an offset conductor clamping portion of a lug 214, and are crimped in place to provide good electrical contact by a pair of crimps or indentations 214c1 and 214c2. Lug 214 also includes a flat portion 214f which defines an aperture 214a.

It should be noted that the term "between" and other terms such as "parallel" have meanings in an electrical context which differ from the meanings in the field of mechanics or in ordinary parlance. More particularly, the term "between" in the context of signal or electrical flow relating to two separate devices, apparatuses or entities does not relate to physical location, but instead refers to the identities of the source and destination of the flow. Thus, flow of signal "between" A and B refers to source and destination, and the flow itself may be by way of a path which is nowhere physically located between the locations of A and B. Similarly, the term "parallel" in an electrical context can mean, for digital signals, the simultaneous generation on separate signal or conductive paths of plural individual signals, which taken together constitute the entire signal. For the case of current, the term "parallel" means that the flow of a current is divided to flow in a plurality of separated conductors, all of which are physically connected together at disparate, spatially separated locations, so that the current travels from one such location to the other by plural paths, which need not be physically parallel.

In FIG. 2a, a commercially available current transducer having a 25 ampere nominal non-limiting range is illustrated as 230. The particular type of transducer which is illustrated is the abovementioned type LTS 25 which, although rated for 25 amperes, is capable of use to peak currents of about 80 amperes. Conductor 222 extends through an aperture 232 in the transducer 230 in a non-contacting or isolated manner. Transducer 230 also includes pins 236, 238, and 240, by which energization potential can be applied to the transducer and signal output can be extracted from the transducer. As with the terms "between" and "parallel," the term "non-contacting" is used in an electrical rather than a mechanical sense.

The term "non-contacting" means that an electrical insulator (which may include free space) lies between the non-contacting electrical conductors, so that the current flow in one is, as a practical matter, unaffected by the voltage on the other. In essence, the term means that a high resistance is interposed between, or lies between, the electrical conductors in question, where the dimension corresponding to "high" depends upon the impedances of the two non-contacting circuits and the amount of allowable interaction.

Those skilled in the art know that electrical current can flow only in a complete circuit, which implies that existence of a single current through a device involves a two-wire connection to the device, one for current "into" the device, and another for "output" current. Thus, an arrangement such as that of FIG. 2A, having "input" and "output" terminals 212, 214, represents only a portion of a circuit in which current flows, namely the current-sensing portion of the circuit. Other portions of the complete current path may include the current utilization device, which in the case of FIG. 1 is a motor winding.

Transducer 230 of FIG. 2a also provides two sets of electrically paralleled pins, only one of which is visible in FIG. 2a, and is designated 234a. A corresponding set on the other or non-visible side is merely a continuation of the pin set 234a. The conductor(s) associated with pin set 234a extend through the same region of the transducer as the conductor 222, and merely provide a corresponding path through the transducer which is available for mounting to a printed-circuit board. Whether the current to be sensed flows through the transducer by way of a conductor extending through aperture 232 or by way of pin set 234a, the transducer acts in a non-contacting manner, which is to say that there is no direct path (except possibly leakage paths) between the conductor carrying the current which is to be measured (either through aperture 232 or by way of pin set 234a) and the signal and power pins 236, 238, and 240. Transducer 230 of FIG. 2a is a closed-loop sensor, in that it includes feedback functions to improve its accuracy.

FIG. 2b is a schematic diagram illustrating the structure of the arrangement 210 of FIG. 2a. It will be seen that the electrical conductors 216, 218, 220, and 222 are electrically connected in parallel, which is to say that the current Is to be sensed flowing between terminals or nodes 212 and 214 divides to flow through the various conductors in inverse proportion to their resistance. Since the four electrical conductors 216, 218, 220, and 222 are identical, identical currents flow through each wire, so long as the contact between the electrical conductors and the lugs 212, 214 is good. Consequently, the current flowing through electrical conductor 222 is only a fraction of the total current flowing between lugs 212 and 214, and the fractional portion is determinable. In the case illustrated in FIGS. 2a and 2b, the current in conductor 222 will be the total current divided by the total number of conductors extending between lugs 212 and 214. In the particular case, there are a total of four wires, so the current in conductor 222 will be the total current divided by four. For a maximum current to be sensed of 100 amperes, a four-wire arrangement such as that of FIGS. 2a and 2b would have 25 nominal amperes through the current sensor 230, which does not exceed its current rating. As described in conjunction with FIG. 5, the maximum measurable current may exceed 25 amperes. Naturally, if there were five conductors in the arrangement of FIG. 2B rather than four, the fraction of the lug-to-lug current which would flow in conductor 222 would be ⅕. If the lug-to-lug current were to be a maximum of 100 amperes, the current through the current transducer would be a maximum of 20 amperes, well within the rated current of the transducer, or alternatively the maximum current to be sensed might be 125 amperes for a 25-ampere rating of the transducer or sensor. Thus, a relatively inexpensive 25-ampere current transducer or sensor can be used to measure a current of 125 amperes. In practice, the peak current capability of such sensors exceeds the rated current, and the number of turns required to provide a given operating range may differ from that set forth above.

More generally, additional paralleled electrical conductors or wires can be used to provide almost any desired current division ratio so as to maintain current through the transducer or sensor within its ratings while allowing many times that current through the entire circuit. Thus, a current with a maximum value of 1000 amperes, could be measured by 25-ampere rated transducer or sensor in the presence of a total of forty (or less) electrically paralleled conductors.

The arrangement of FIG. 2a has the advantage that all of the high-current conductors 216, 218, 220, and 222 are in the same environment, so that any air flow over their surfaces will tend to be the same, and the thermal conduction to the lugs should also be the same. Consequently, the temperature rise in each of the electrical conductors should be approximately equal. It is expected that any current-splitting deviation attributable to temperature differences will be small enough to not affect the performance. One possible disadvantage of the arrangement of FIG. 2A is that slight differences in contact force to the various paralleled wires at the crimped portions of the lugs 212 and 214 may provide differing resistance connections. Such different resistances may heat differently, and result in substantial differences in the effective resistance through the various paralleled wires, which could adversely affect sensing accuracy.

FIG. 3a is a simplified perspective or isomeric view of a printed-circuit current sensing assemblage as described in the Roden et al. patent. In FIG. 3a, an assemblage 310 includes a printed board assembly 320 and two connecting posts or terminals 312 and 314. Posts or terminals 312, 314 are the terminals between which the large electrical current which is to be sensed flows. Posts or terminals 312 and 314 each include an insulating support 312i, 314i, respectively, and an electrically conductive ring 312r, 314r, respectively, which is in electrical contact with its post or terminal.

Printed-circuit assemblage 320 of FIGS. 3a includes a dielectric substrate 322, with patterned "printed circuit" conductors 324 and 326 on its upper and lower sides, respectively. As illustrated, substrate 322 defines first and second apertures 332 and 334 dimensioned to accept posts 312 and 314, respectively, for allowing rings 312r and 314r of posts 312 and 314 to make contact with the lower printed circuit conductor 326, and for allowing posts 312 and 314 to make electrical contact with upper printed conductor 324 with the aid of conductive washers 312w and 314w and nuts 312N, 314N. Thus, the upper printed conductor 324 and the lower printed conductor 326 are effectively in electrical parallel.

A printed gap pattern 340 is defined on the upper printed conductive surface 324 of printed circuit assemblage 320, as illustrated in FIGS. 3a and 3b. As illustrated, the gap 340 defines plural gap sections. The principal gap which appears on the conductive upper surface 329 divides the upper conductive surface 324 longitudinally into two conductive portions 1 and 2, where the term "longitudinally" refers to a direction extending from aperture 332 to aperture 334. These two electrical conductors are in electrical parallel as to current flowing from post 312 to post 314, much as the conductors 222 and 220 are in parallel in FIG. 2a. There is a difference between the situation in FIGS. 2a and that of FIG. 2b, and that difference lies in the fact that the dimensions of the electrical conductors 1 and 2 are different from each other. This allows control of the relative current division by controlling the dimensions, rather than the number of, the paralleled conductors. More particularly, the printed-circuit board fabrication techniques result in a generally uniform conductor thickness, which may be, for example, 0.035 inch. Thus, the cross-sectional dimension of conductors 1 and 2 depends only on their widths. If the width of conductor 1 were, say, three times the width of conductor 2, its resistance would be one-third that of conductor 2. The current division could in that case be readily determined to be 1/(3+1) or ¼, meaning that the current in conductor 2 would be ¼ of the total current flowing from post 312 to post 314.

The printed circuit upper pattern illustrated FIG. 3b includes an open or nonconductive region 338u, which is provided to accommodate the power and signal pins of the transducer and the pins or sockets of a connector allowing connection of an external cable to the printed circuit board for the purpose of energizing the transducer and coupling signal therefrom.

The printed-circuit arrangement described in conjunction with FIGS. 3a and 3b has the advantages of consistency from unit to unit, since they are fabricated by batch-like processing. In addition, the relatively flat morphology allows for relatively large heat dissipation in response to airflow over the large, flat surfaces. It further provides a convenient and inexpensive mounting for the current sensor or transducer 230. As illustrated in FIG. 3a, transducer 230 is mounted on the upper surface of printed circuit board 320, with its through three-pin set 234a extending into three apertures designated together as 364a and are soldered or otherwise electrically bonded to conductor 1. The corresponding portions of pin set 234a on that side of transducer 230 which is not visible in FIG. 3a extend into apertures designated, 364b in conductor 1. As best illustrated in FIG. 3b, a portion 342u of gap 340 extends between aperture sets 364a and 364b, so as to prevent the direct flow of current, and so as to force any current flowing in conductor 1 to pass through the transducer 230 by way of its pin set 234a. Also, when transducer 230 is mounted in place as illustrated in FIG. 3a, its signal and power pins 236, 238 and 240 extend through apertures 386, 388, and 390, respectively, in board 320, and are soldered to conductors on the reverse side, for making appropriate connections. The presence of gap 342L on the reverse or underside of the board prevents the lower printed conductor 326 from short-circuiting the pins 364a of the transducer.

FIG. 3c illustrates a plan view of the underside of printed circuit board 320, showing the printed pattern thereon. The surface of conductive pattern 326 faces the viewer. As illustrated, the pattern defines an open area or region including a lower gap portion 342L and a portion 338L, which provides clearance for pins and conductors. Open or nonconductive portion 338L also includes three conductors which connect pins of the transducer to corresponding pins of a connector. As illustrated, pin 386 is connected by a conductor 396 to pin 4 of set 0003, pin 388 is connected by way of a conductor 398 to pin 3 of set 0003, and pin 390 is connected by way of a conductor 400 to pin 1 of set 0003. Pin 2 of set 0003 remains unconnected. The illustrated pin or socket set 0003 is arranged, in one arrangement, for connection of a MOLEX type 70543-0003 connector.

FIG. 4 is a perspective or isometric view of another current dividing current sensing arrangement 410 for use with a current sensor having rated range of current less than the maximum current to be sensed. In FIG. 4, an electrically conductive bus bar 412 defines two apertures 432, 434 dimensioned and spaced for connection to posts such as posts 312, 314 of FIG. 3a. Bus bar 412 supports four electrically conductive support posts 420a, 420b, 420c, and 420d. A printed-circuit board designated generally as 422 includes first and second mutually isolated conductive circuit portions 401 and 402 with a gap 442 therebetween. Electrically conductive portion or pattern 401 is electrically connected to posts 420a and 420b, and electrically conductive portion 402 is electrically connected to posts 420c and 420d. A current-sensing transducer 230 is coupled across the gap 442 lying between the conductive patterns 401 and 402. Current transducer or sensor 230 senses the current flowing from conductor 401 to 402 (or vice versa). When properly powered, transducer 230 produces its sensed signal in response to the current being sensed at an output terminal or port (not illustrated in FIG. 4), from which the signal is coupled (by paths not illustrated) to a socket of MOLEX connector 4003. As a result[]of the layout of the arrangement of FIG. 4, electrically conductive portion 401 is connected to a part of bus bar 412 which is spaced in the direction of current flow between apertures 432 and 434 from the part of the bus bar to which conductive portion 402 is connected. As a result of this spacing, that portion of the bus bar 412 lying between the locations or transverse plane of posts 420a, 420b and the locations or transverse plane of posts 420c, 420d represents a shunt resistance which parallels the path extending from conductor 401 through the sensor 230 to conductor 402. As a result, sensor 230 senses a proportion of the total current flowing from aperture 432 to aperture 434 of bus bar 412.

Thus, in general, according to the Roden et al. patent, a non-contacting current sensor having a rated capacity significantly less than the motor (or other) current to be measured is coupled to an electrical conductor for sensing the current in that conductor. The electrical conductor is paralleled by one or more additional similar conductors, so that only a fraction or portion of the current to be measured flows through the conductor associated with the sensor. The current sensor elements may be mounted on a printed-circuit board, which supports the elements, and also has one or more printed patterns which define a conductor associated with the sensor and at least one other conductor through which current can flow in parallel with the current in the sensor. Improved or alternative arrangements are desired.

SUMMARY OF THE INVENTION

An apparatus according to an aspect of the invention comprises an electrical machine including at least one of a rotor and a stator At least one of the rotor and stator includes a multiturn winding of plural paralleled electrical conductors. A current sensing apparatus is provided, which current sensing apparatus including a first path through which a current to be sensed passes. The current sensing apparatus is capable of producing a sensed signal in response to the current in the first electrical path, up to a predetermined maximum value of the current in the first path, above which current the sensed signal is limited. The current sensing apparatus may be linear over its range. An interconnection arrangement is coupled to the multiturn winding of plural paralleled electrical conductors of the one of the rotor and stator and to the first path of the current sensing apparatus, for causing the current of a selected number, less than the total number, of the plural paralleled electrical conductors to pass through the first path. In a preferred embodiment of this aspect of the invention, the interconnection arrangement includes the extension of turns of the selected number of plural paralleled electrical conductors through the first path. In another embodiment of this aspect of the invention, the selected number is one. In a most preferred embodiment of this aspect of the invention, the current sensing apparatus is non-contacting as between the first current sensing path and that port at which the sensed signal is generated. The machine may be an electrical motor.

A vehicle according to another aspect of the invention is powered at least in part by an electric motor. The vehicle comprises a rotational vehicle drive device such as a cog or wheel. A motor is coupled to the rotational vehicle drive device, for driving the vehicle when the electric motor drives the rotational vehicle drive device. The electric motor includes at least one of a rotor and a stator, which one of the rotor and stator includes a first winding of a plurality of mutually paralleled conductors. A source of electrical energy is provided. An electrical power path extends between the source of electrical energy and the motor. The electrical power path includes a controllable electrical power control arrangement, for controllably coupling electrical energy between (in an electrical sense) the source of electrical energy and the motor. A control circuit is coupled to the controllable electrical power control arrangement, for responding to at least operator control signals and motor current signals, for controlling the electrical motor for driving the vehicle under operator control. A current sensing apparatus is associated with a selected number of the conductors of the first winding which is less than the total number of conductors in the first winding, for sensing at least one component of motor current. The current sensing apparatus has a maximum current for which a sensed signal, which may be a linear signal, is generated which is greater than the maximum current in the selected number of conductors but less than the maximum current in the first winding. In a preferred embodiment of this aspect of the invention, the current sensing apparatus is a non-contacting current sensing apparatus.

A method according to a further aspect of the invention is for generating a signal representative of current in a magnetic winding of an electromechanical machine. This method comprises the steps of procuring a current sensor which produces a current-representative signal, which may be a linear signal, up to a predetermined maximum current, and winding the magnetic winding with turns of a plurality of mutually paralleled electrical conductors. Only so many of the plurality of mutually paralleled electrical conductors of the magnetic winding are coupled to the current sensor as will carry a current no greater than the predetermined maximum current at the full current of the magnetic winding.

BRIEF DESCRIPTION OF THE DRAWING

FIG. 3b is a plan view of the pattern of the upper printed conductor of the board of FIG. 3a, and FIG. 3c is a plan view of the pattern of the lower printed conductor of the board of FIG. 3a;

DESCRIPTION OF THE INVENTION

Figure 1:
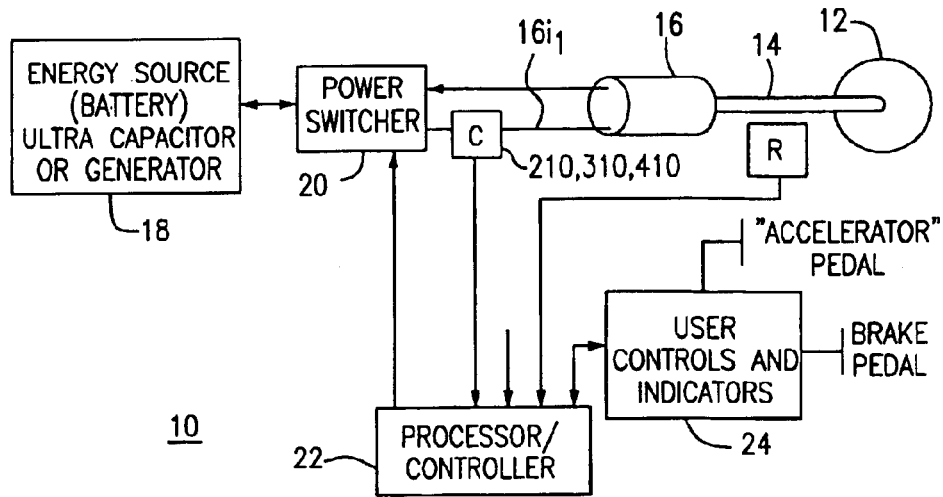
FIG. 1 is a simplified block diagram of a portion of an electrically driven vehicle as described in prior U.S. Pat. No. 6,528,960.
Figure 6:
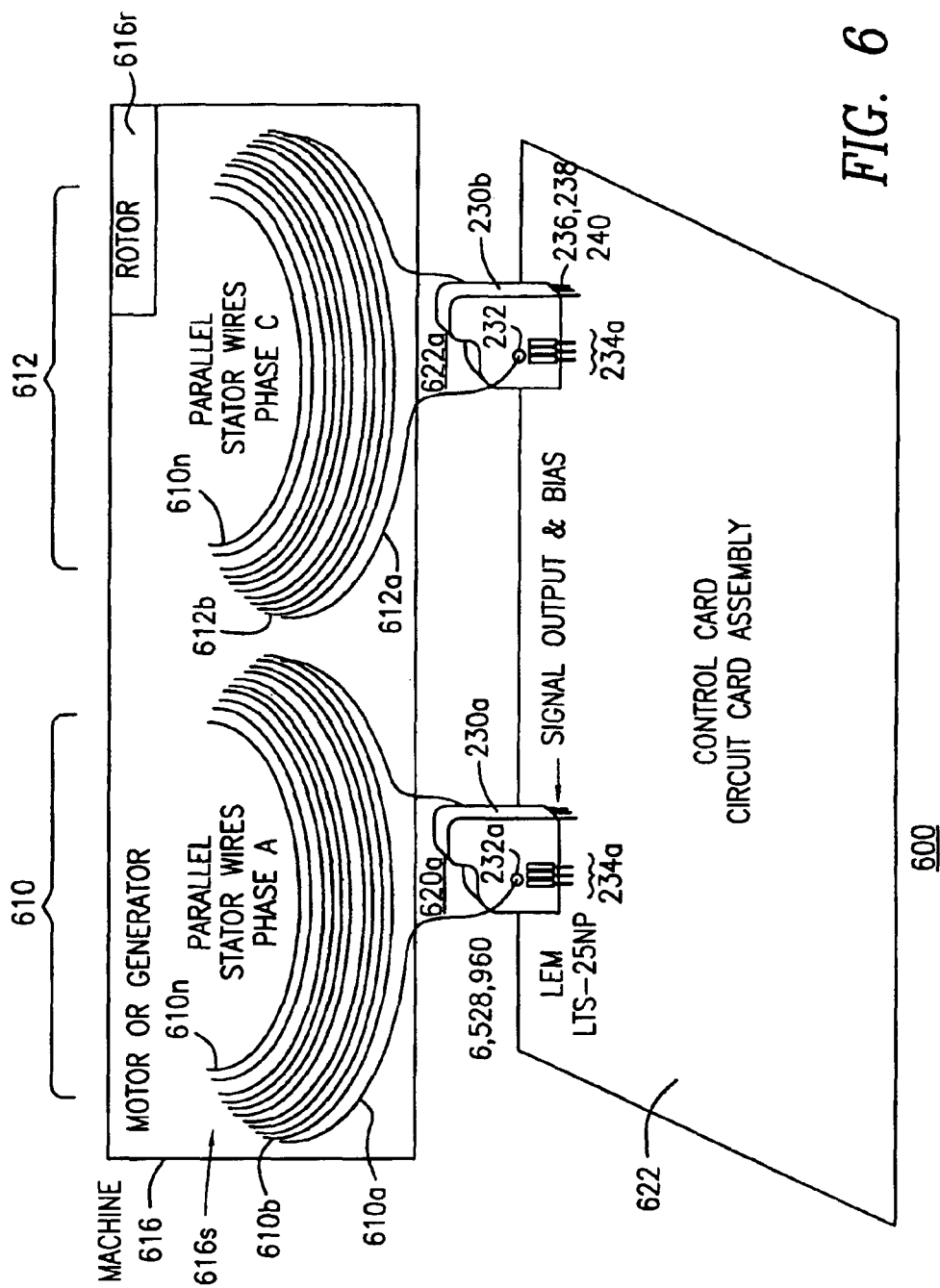
FIG. 6 is a simplified illustration of a machine with plural phase windings on the stator, and their connection according to an aspect of the invention.

In FIG. 6, the machine (motor or generator) is designated 616, and may be viewed (with one exception) as being equivalent to motor 16 of FIG. 1. Within machine 616, a plurality of stator windings are illustrated by a first stator winding 610 and a second stator winding 612. Stator winding 610 may be associated with an A phase of current or voltage, and stator winding 612 may be associated with a C phase. Other phases may be associated with other windings (not illustrated). Under appropriate conditions, the windings 610 and 612 may be rotor windings instead of stator windings. The salient difference between machine 616 of FIG. 6 and machine 16 of FIG. 1 is that the current sensing (performed by C of FIG. 1) is instead performed on the actual windings of the machine, rather than on external connections.

A motor or generator machine is often wound with several small gauge wires in parallel, for ease of winding, since several small wires bend more easily than a single large wire, and additionally because use of several small wires aids in slot filling. Each of the stator windings 610, 612 of FIG. 6 consists of multiple turns (only a portion of one turn shown for each winding) of paralleled wire. Thus, winding 610 includes a plurality of individually insulated conductors, some of which are designated 610a, 610b, . . . , 610n. Similarly, winding 612 includes a plurality of individual conductors, some of which are designated 612a, 612b, . . . , 612n. As illustrated in FIG. 6, one of the paralleled conductors, namely conductor 610a, of stator winding 610 is looped (620a) away from the principal portion of the associated winding 610, and passed through the sensing aperture 232 of a current sensor 230a. Similarly, one of the paralleled conductors, namely conductor 612a, of stator winding 612 is looped (620b) away from the principal portion of the associated winding 612, and passed through the sensing aperture 232 of a current sensor 230b. Other sensors (not illustrated) may be associated with other conductors of windings which are not shown. Sensors 230a and 230b are mounted on a printed-circuit card 622, which may be the same card as that which carries the motor controller processing functions. Ideally, card 622 is mounted within the housing of the machine with which it is associated, or at least immediately adjacent the exterior, so as to keep to a minimum the additional length of the "sense" conductors which loop through the sensors. Reduction of this extra length is desirable, in order to keep the resistance of the sense conductor substantially equal to that of the non-sense conductors (that is, the remaining conductors 610b, . . . , 610n when considering sense conductor 610a). Maintaining substantially equal resistance in the sense conductor tends to assure equal currents in the paralleled conductors of each winding 610, 612. The equality of currents is contributed to by the likelihood that the conductors of each winding are typically of a single gauge, from the same spool, and are typically many feet in length. This latter is particularly significant, since the substantial length of each conductor of a machine winding tends to reduce the effects of end resistance at the point of the paralleling of the conductors. Making the arrangement of FIG. 2A with conductors several feet long would be unwieldy and more expensive than with short wires. In the case of the inventive arrangement of FIG. 6, the additional length of the conductors is already required for the machine itself, so the advantage of long conductors in the current sensing arrangement is achieved without substantial additional cost for conductors, although some additional cost may be incurred in forming the loops 620a, 622a to pass through the current sensors 230a, 230b, respectively. Thus, the cost of an arrangement according to the invention is likely to be lower, overall, than the cost of a separate machine with separate sensors such as those of FIG. 2A. If the conductors of a winding are not of exactly the same length, any resulting inaccuracy in the sensed current can be cured by calibration of the sensed signal, and storing the calibration information in digital memory associated with the particular machine winding.

Figure 2A:
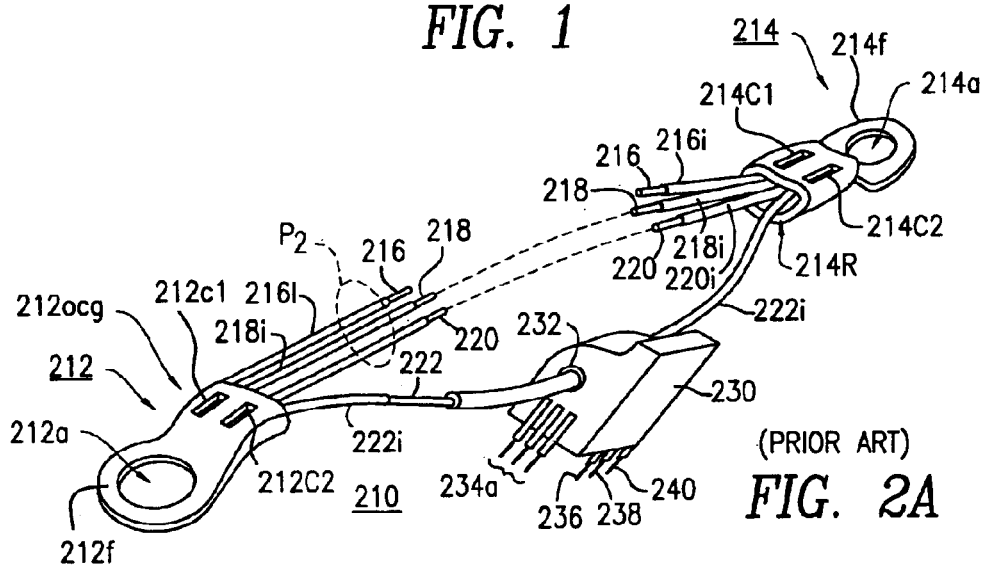
FIG. 2a is a perspective or isometric view of a prior art current measuring arrangement, which may be used in the vehicle of FIG. 1.
Figure 2B:
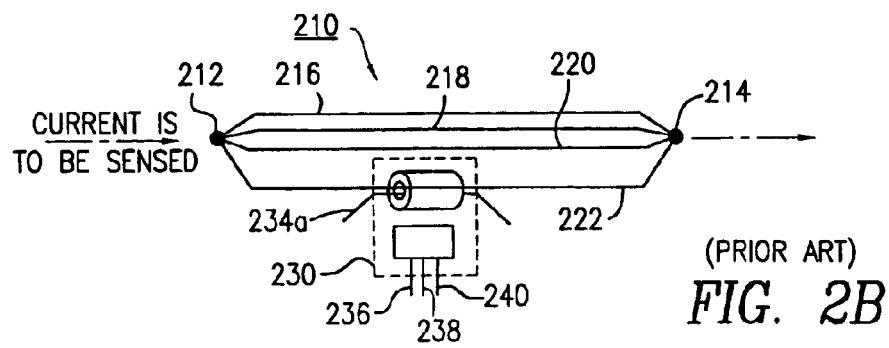
FIG. 2b is a schematic diagram thereof.
Figure 3A:
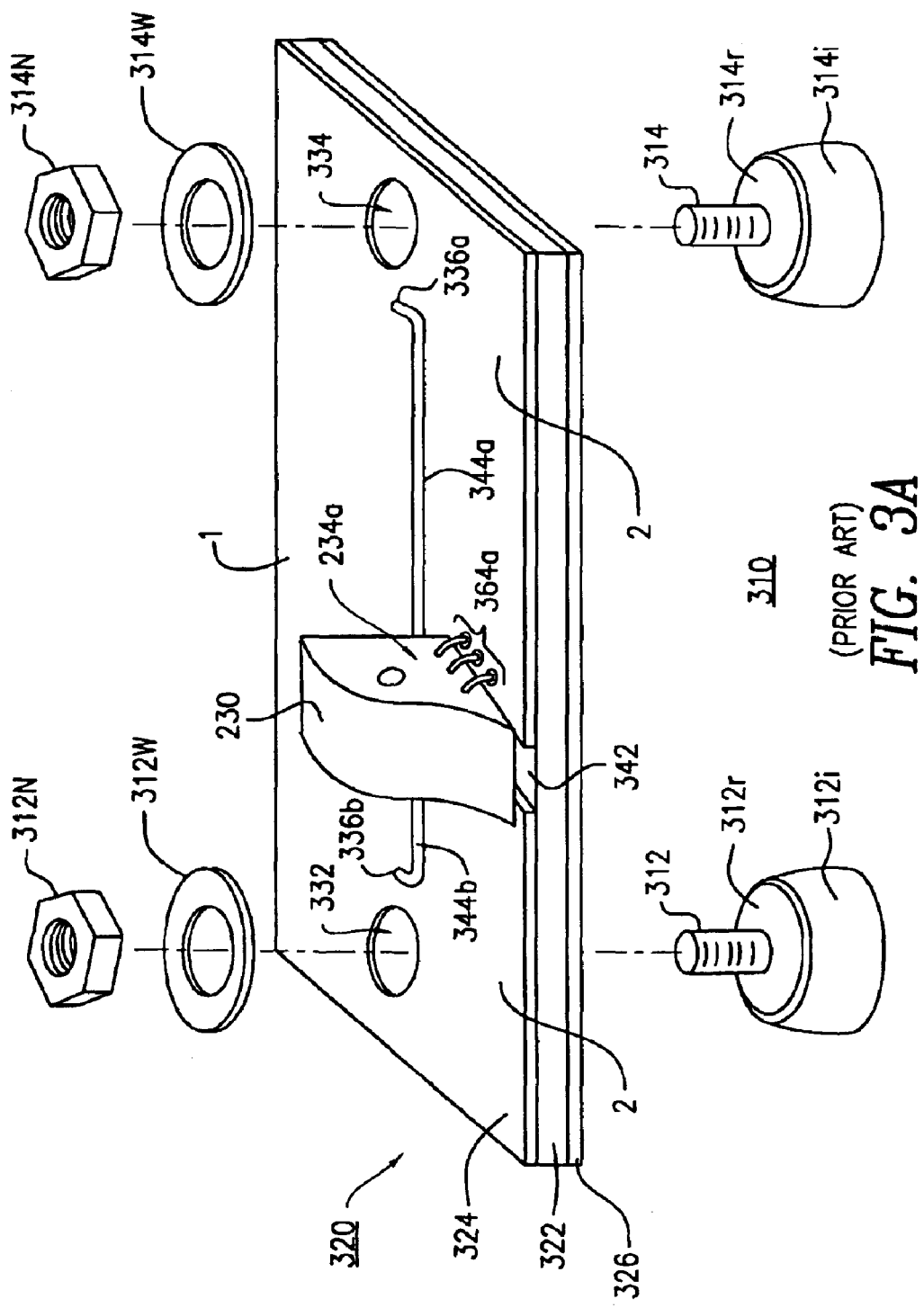
FIG. 3a is a simplified perspective or isometric view of a prior-art printed-circuit board assemblage usable in the arrangement of FIG. 1.
Figure 3B:
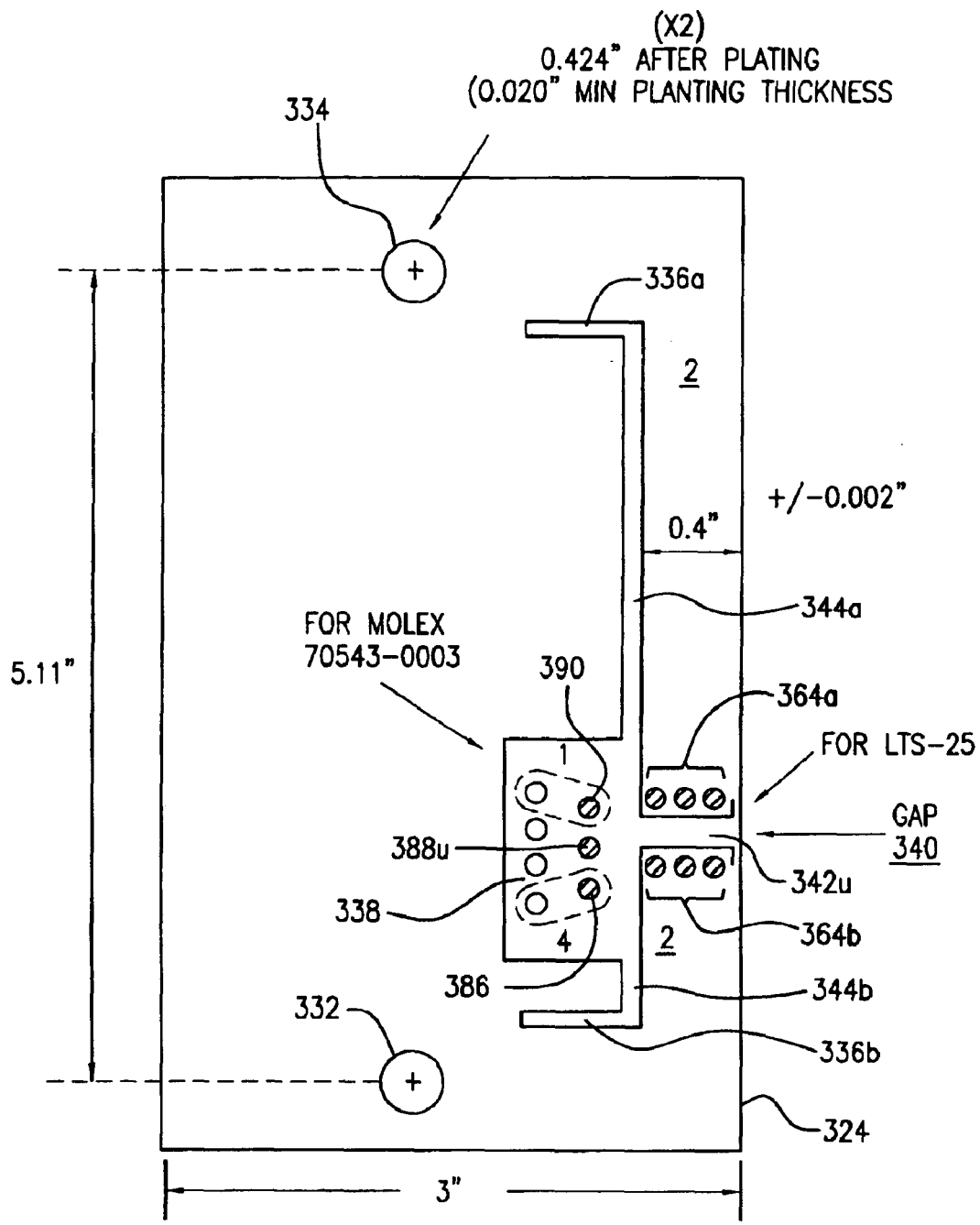
Figure 3C:
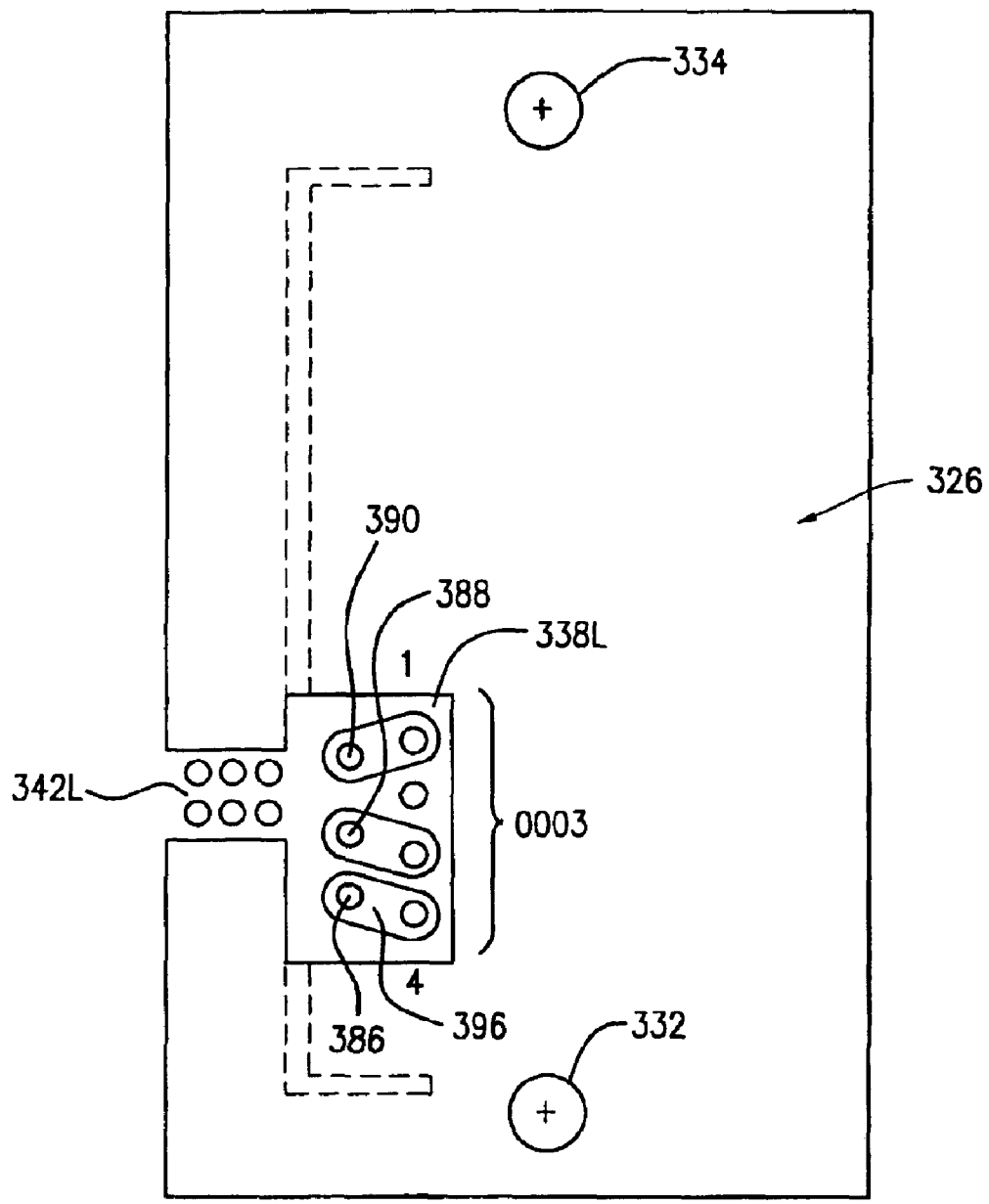
Figure 4:
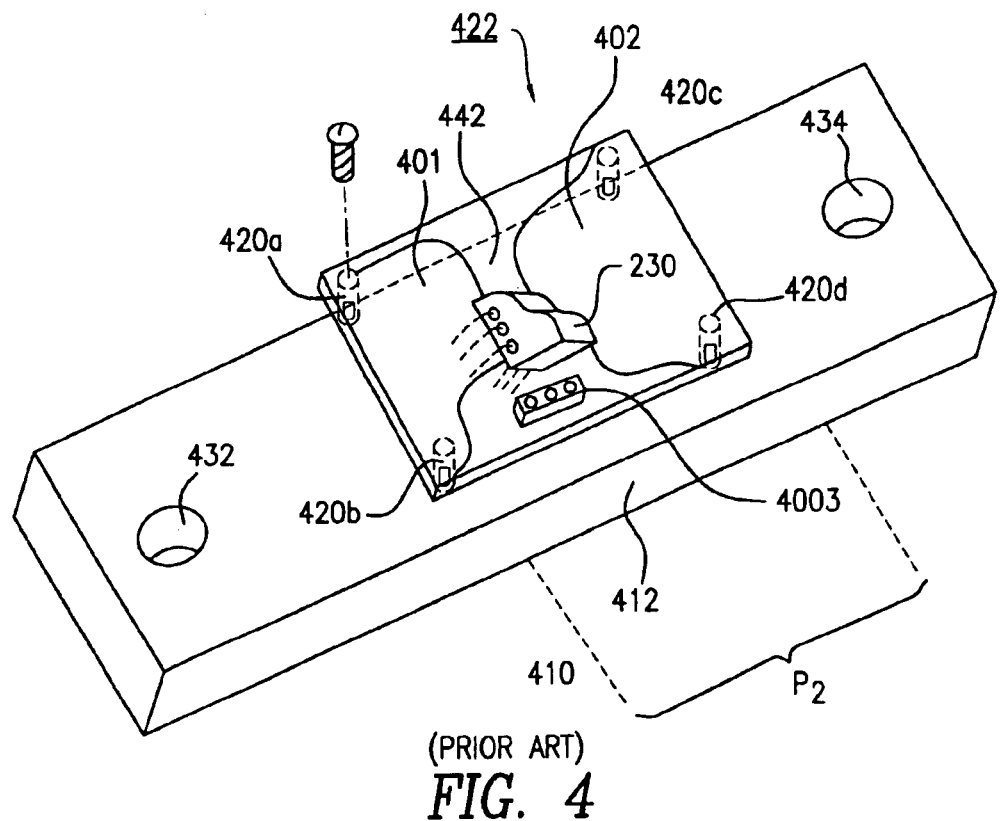
FIG. 4 is a simplified perspective or isometric view of a prior-art printed-circuit arrangement using an off-board shunting arrangement including a portion of a bus bar.
Figure 5:
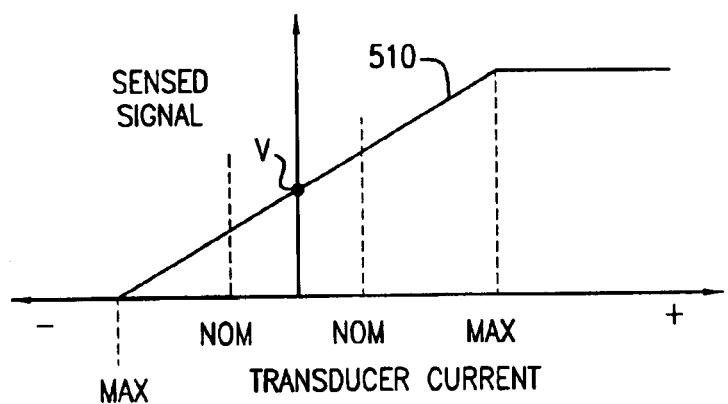
FIG. 5 is a simplified representation of the characteristics of a particular type of non-contacting current sensor, illustrating its limiting characteristic.
Figure 7:
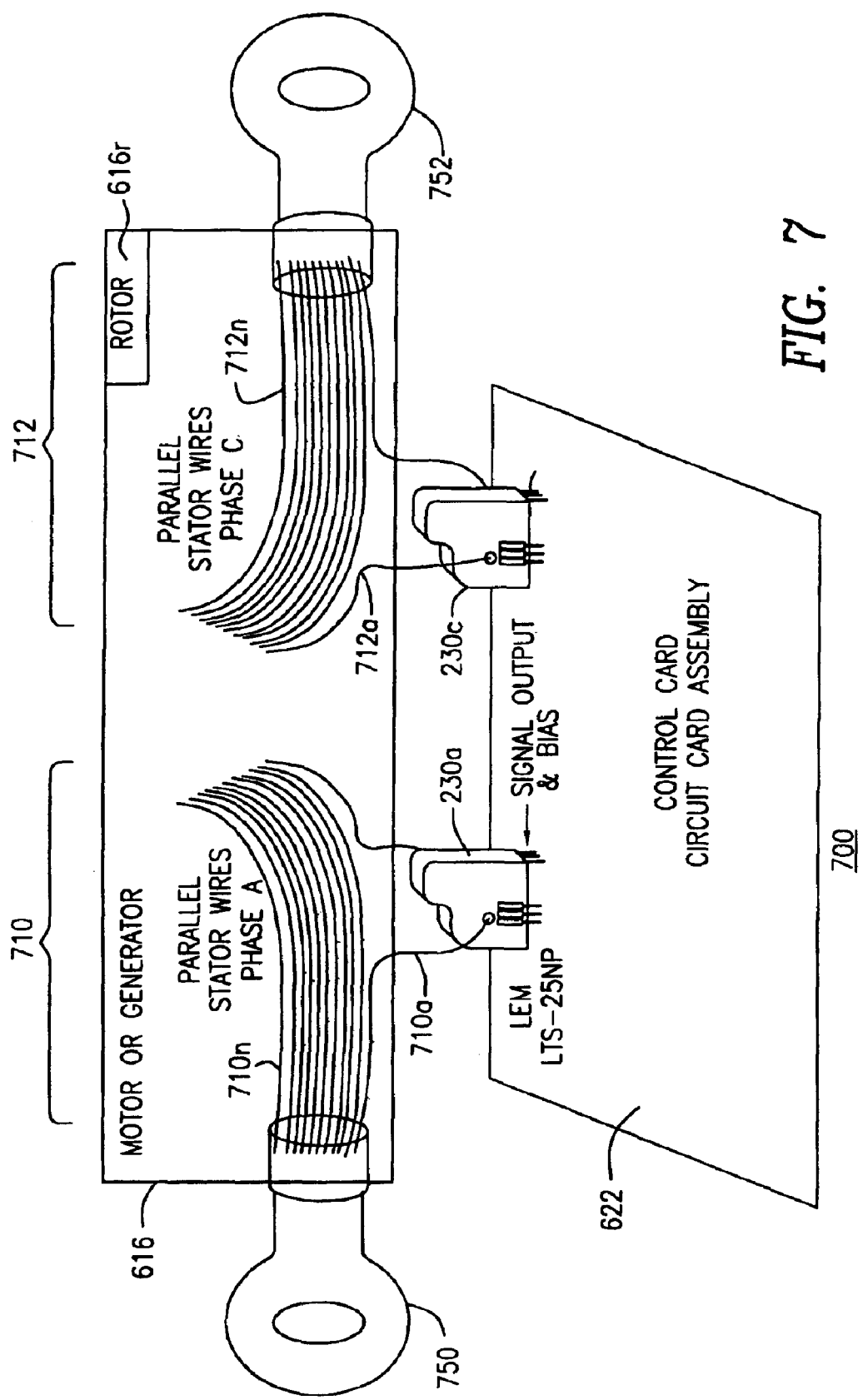
FIG. 7 is a simplified illustration similar to FIG. 6, showing a possible location for the current sensor near a lug to which the conductors of a winding attach.
Figure 8:
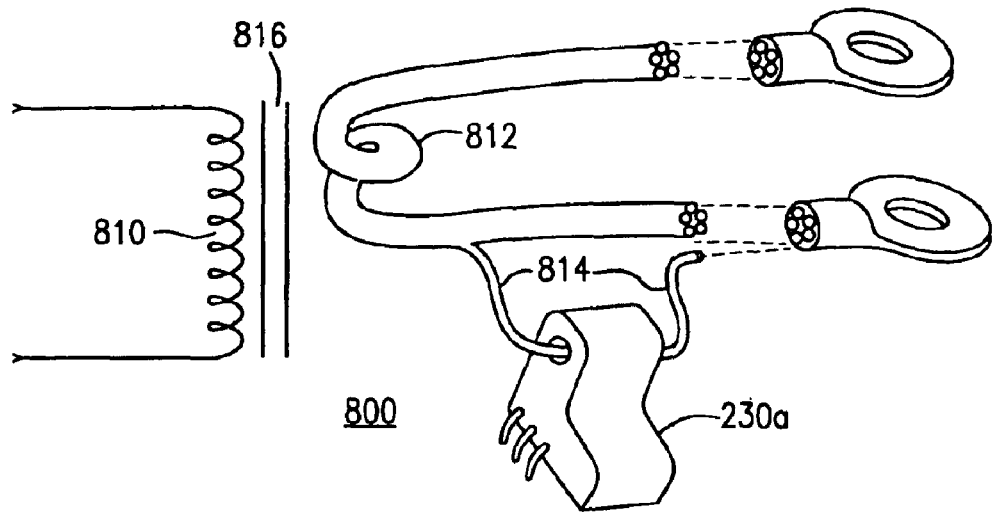
FIG. 8 is a perspective view of a current measurement arrangement for the winding of a transformer.
Figure 9:
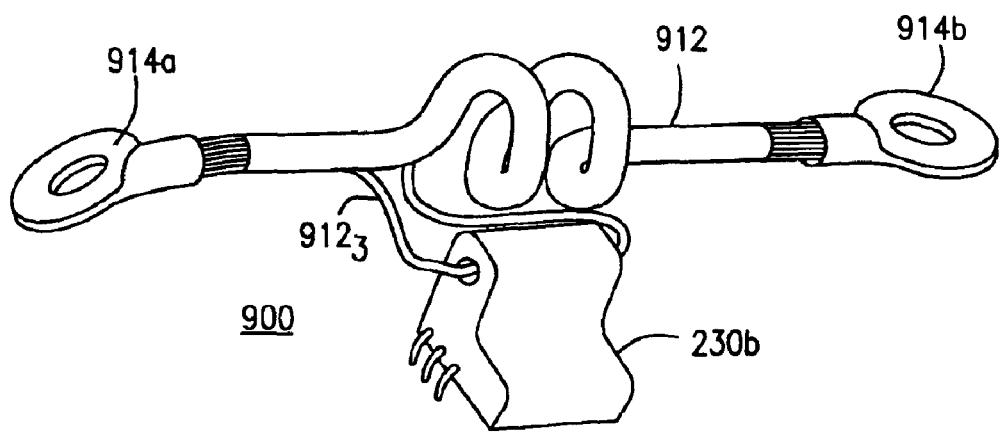
FIG. 9 is a perspective view of a current measurement arrangement for the winding.

FIG. 7 illustrates an arrangement 700 in which current sensor 230a is linked to a conductor 710a of a winding 710 of parallel stator wires for phase A, and where conductor 710a and all the other conductors of winding 710, including conductor 710n, are fastened to a lug 750, as described in conjunction with FIG. 2a. Similarly, a current sensor 230c is associated with a conductor 712a of a parallel set of stator conductor windings 712. Conductor 712a, and all the other conductors of winding 712, including conductor 712n, are fastened to a further lug 252.

Other embodiments of the invention will be apparent to those skilled in the art. For example, instead of a drive wheel, the rotational vehicle drive device 12 could be a gear, as in the context of a high-angle railway. It should be noted that the inductance of the various paralleled paths may need to be controlled or kept equal in the case in which the circuit impedances are low.

An apparatus according to an aspect of the invention comprises an electrical machine (616) including at least one of a rotor (616r) and a stator (616s). At least one of the rotor (616r) and stator (616s) includes a multiturn winding (610) of plural paralleled electrical conductors (610a, 610b, . . . , 610n). A current sensing apparatus (230a) is provided, which current sensing apparatus (230a) including a first path (232a) through which a current to be sensed passes. The current sensing apparatus (230a) is capable of producing a sensed signal (at conductors 236, 238, 240) in response to the current in the first electrical path (232a), up to a predetermined maximum value of the current in the first path (232a), above which current the sensed signal is limited. The current response may or may not be linear within the operating range. An interconnection arrangement (620a) is coupled to the multiturn winding (610) of plural paralleled electrical conductors (610a, 610b, . . . , 610n) of the one of the rotor (616r) and stator (616s) and to the first path (232a) of the current sensing apparatus (230a), for causing the current of a selected number (one in the example of FIG. 6), less than the total number (n), of the plural paralleled electrical conductors (610a, 610b, . . . , 610n) to pass through the first path (232a). In a preferred embodiment of this aspect of the invention, the interconnection arrangement (620a) includes the extension of turns of the selected number of plural paralleled electrical conductors. (610a, 610b, ..., 610n) through the first path (232a). In another embodiment of this aspect of the invention, the selected number is one. In a most preferred embodiment of this aspect of the invention, the current sensing apparatus (230a) is non-contacting as between the first current sensing path (234a, 232a) and that port (236, 238, 240) at which the sensed signal is generated. The machine (616) may be an electrical motor.

A vehicle (10) according to another aspect of the invention is powered at least in part by an electric motor (616). The vehicle (10) comprises a rotational vehicle (10) drive device such as a cog or wheel (12). A motor (616) is coupled to the rotational vehicle (10) drive device (12), for driving the vehicle (10) when the electric motor (616) drives the rotational vehicle (10) drive device (12). The electric motor (616) includes at least one of a rotor (616r) and a stator (616s), which one of the rotor (616r) and stator (616s) includes a first winding (610) of a plurality of mutually paralleled conductors (610a, 610b, ..., 610n). A source (18) of electrical energy is provided. An electrical power path (20, 22) extends between the source (18) of electrical energy and the motor (616). The electrical power path (20, 22) includes a controllable electrical power control arrangement (20), for controllably coupling electrical energy between (in an electrical sense) the source (18) of electrical energy and the motor (616). A control circuit (22) is coupled to the controllable electrical power control arrangement (20), for responding to at least operator control signals and motor current signals, for controlling the electrical motor (616) for driving the vehicle (10) under operator control. A current sensing apparatus (230a) is associated with a selected number (one in the example) of the conductors (610a, 610b, ..., 610n) of the first winding (610) which is less than the total number (n) of conductors (610a, 610b, ..., 610n) in the first winding (610), for sensing at least one component of motor current. The current sensing apparatus (230a) has a maximum current (25 Amperes in the example) for which an approximately linear sensed signal is generated which is greater than the maximum current in the selected number (one) of conductors (610a, 610b, ..., 610n) but less than the maximum current (n times 25 Amperes) in the first winding (610). In a preferred embodiment of this aspect of the invention, the current sensing apparatus (230a) is a non-contacting current sensing apparatus (230a).

A method according to a further aspect of the invention is for generating a signal representative of current in a magnetic winding (610) of an electromechanical machine (616). This method comprises the steps of procuring a current sensor (230a) which produces a current-representative signal up to a predetermined maximum current (which may be a linearly related signal), and winding the magnetic winding (610) with turns of a plurality (n) of mutually paralleled electrical conductors (610a, 610b, 610n). Only so many of the plurality of mutually paralleled electrical conductors (610a, 610b, ..., 610n) of the magnetic winding (610) are coupled to the current sensor (230a) as will carry a current no greater than the predetermined maximum current at the full current of the magnetic winding.

What is claimed is:

1. An apparatus comprising:
    an electrical machine including at least one of a rotor and a stator, at least one of said rotor and stator including a multiturn winding of plural paralleled electrical conductors;
    a current sensing apparatus, said current sensing apparatus including a first path through which a current to be sensed passes, said current sensing apparatus being capable of producing a sensed signal in response to the current in said first electrical path, up to a predetermined maximum value of said current in said first path, above which current said sensed signal is limited; and
    interconnection means coupled to said multiturn winding of plural paralleled electrical conductors of said one of said rotor and stator and to said first path of said current sensing apparatus, for causing the current of a selected number, less than the total number, of said plural paralleled electrical conductors to pass through said first path.

2. An apparatus according to claim 1, wherein said interconnection means comprises extending turns of said selected number of plural paralleled electrical conductors through said first path.

3. An apparatus according to claim 1, wherein said selected number is one.

4. An apparatus according to claim 1, wherein said current sensing apparatus is non-contacting as between said first current sensing path and that port at which said sensed signal is generated.

5. An apparatus according to claim 1, wherein said machine is a motor.

6. An apparatus according to claim 1, wherein said current sensing apparatus is capable of producing a linear sensed signal in response to the current in said first electrical path.

7. A vehicle powered at least in part by an electric motor, said vehicle comprising:
    a rotational vehicle drive device;
    a motor coupled to said rotational vehicle drive device, for driving said vehicle when said electric motor drives said rotational vehicle drive device, said electric motor including at least one of a rotor and a stator, which one of said rotor and stator includes a first winding of a plurality of mutually paralleled conductors;
    a source of electrical energy;
    an electrical power path extending between said source of electrical energy and said motor, said electrical power path including a controllable electrical power control arrangement, for controllably coupling electrical energy between said source of electrical energy and said motor;
    a control circuit coupled to said controllable electrical power control arrangement, for responding to at least operator control signals and motor current signals, for controlling said electrical motor for driving said vehicle under operator control;
    a current sensing apparatus associated with a selected number of said conductors of said first winding which is less than the total number of conductors in said first winding, for sensing at least one component of motor current, said current sensing apparatus having a maximum current for which a sensed signal is generated which is greater than the maximum current in said selected number of conductors but less than the maximum current in said first winding.

8. A vehicle according to claim 7, wherein said current sensing apparatus is a non-contacting current sensing apparatus.

9. A vehicle according to claim 7, wherein said current sensing apparatus has a maximum current for which a linear sensed signal is generated which is greater than the maximum current in said selected number of conductors but less than the maximum current in said first winding.

10. A method for generating a signal representative of current in a magnetic winding of an electromechanical machine, said method comprising the steps of:

procuring a current sensor which produces a current-representative signal up to a predetermined maximum current, which current-representative signal may be linearly related to the current;

winding said magnetic winding with turns of a plurality of mutually paralleled electrical conductors;

coupling to said current sensor only so many of said plurality of mutually paralleled electrical conductors as will carry a current no greater than said predetermined maximum current at the full rated current of said magnetic winding.

\* \* \* \* \*